US012451327B2

(12) United States Patent
Yamazawa et al.

(10) Patent No.: US 12,451,327 B2
(45) Date of Patent: Oct. 21, 2025

(54) APPARATUS FOR PLASMA PROCESSING

(71) Applicant: Tokyo Electron Limited, Tokyo (JP)

(72) Inventors: Yohei Yamazawa, Tokyo (JP); Kazuki Moyama, Taiwa-cho (JP); Barton Lane, Austin, TX (US); Merritt Funk, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 160 days.

(21) Appl. No.: 17/649,823

(22) Filed: Feb. 3, 2022

(65) Prior Publication Data

US 2023/0282446 A1 Sep. 7, 2023

(51) Int. Cl.
*H01J 37/32* (2006.01)

(52) U.S. Cl.
CPC ..... *H01J 37/3211* (2013.01); *H01J 37/32091* (2013.01); *H01J 37/321* (2013.01); *H01J 37/32577* (2013.01)

(58) Field of Classification Search
CPC ............. H01J 37/3211; H01J 37/32091; H01J 37/321; H01J 37/32577; H01J 37/32082–32183
See application file for complete search history.

(56) References Cited

U.S. PATENT DOCUMENTS 9,767,996 B2 9/2017 O'Neill et al.
2002/0175869 A1* 11/2002 Wilcoxson ........ H01J 37/32467 343/742
2004/0040939 A1* 3/2004 Oh ........................ H01J 37/321 219/121.36
2008/0178806 A1* 7/2008 Kim ...................... H01J 37/321 118/723 R
2008/0223521 A1* 9/2008 Kim ...................... H01J 37/321 156/345.1
2011/0104902 A1* 5/2011 Yamazawa ........... H01J 37/3211 438/758
2012/0073757 A1* 3/2012 Yamazawa ........... H01J 37/3211 156/345.48
2012/0074100 A1* 3/2012 Yamazawa ........ H01J 37/32174 216/68
2012/0305527 A1* 12/2012 Kim ...................... H01Q 21/06 343/757
2015/0014276 A1* 1/2015 Yamazawa .......... H01J 37/3244 216/68
2015/0097478 A1* 4/2015 Knyazik .............. H01J 37/3211 315/34
2016/0071701 A1 3/2016 Lane
(Continued)

FOREIGN PATENT DOCUMENTS

KR 20120040335 A 4/2012
KR 20170022902 A 3/2017

OTHER PUBLICATIONS

International Search Report and Written Opinion, International Application No. PCT/US2023/012149, dated May 30, 2023, 10 pages.

*Primary Examiner* — Aiden Lee
(74) *Attorney, Agent, or Firm* — Slater Matsil, LLP

(57) ABSTRACT

An antenna includes an inner structure, an outer structure, and a plurality of interconnecting structures coupling the inner structure to the outer structure. The plurality of interconnecting structures is axisymmetric with respect to a center of the antenna. Each interconnecting structure has an azimuthal component of at least 30 degrees.

9 Claims, 10 Drawing Sheets

(56) References Cited

U.S. PATENT DOCUMENTS

| | | | | |
|---|---|---|---|---|
| 2016/0150629 | A1 | 5/2016 | Lee | |
| 2017/0084427 | A1 | 3/2017 | Um et al. | |
| 2017/0186585 | A1* | 6/2017 | Zuo | H01J 37/3211 |
| 2019/0088449 | A1* | 3/2019 | Galstyan | H01J 37/32724 |
| 2020/0058467 | A1* | 2/2020 | Yamazawa | H01J 37/3211 |
| 2020/0357606 | A1* | 11/2020 | Yamazawa | H01J 37/3244 |

* cited by examiner

APPARATUS FOR PLASMA PROCESSING

TECHNICAL FIELD

The present disclosure generally relates to semiconductor processing technology and, in particular embodiments, to an apparatus for radiating electromagnetic waves in a plasma processing system for treating a substrate therein.

BACKGROUND

Plasma processing is extensively used in the manufacturing and fabricating high-density microscopic circuits within the semiconductor industry. In a plasma processing system, an electromagnetic wave radiated into a plasma chamber generates an electromagnetic field. The generated electromagnetic field heats electrons in the chamber. The heated electrons ignite plasma that treats the substrate in a process such as for etching, deposit, oxidation, sputtering, or the like. Antennas are used to generate the plasma in the plasma chamber and may be capacitively coupled or inductively coupled to the plasma.

A non-uniform electromagnetic field within the plasma processing chamber results in a non-uniform plasma which in turn results in a non-uniform treatment of the substrate due to different portions of the substrate being treated with varying densities of plasma. An apparatus and system that improves the uniformity of the electromagnetic field in a plasma processing system are, thus, desirable. An antenna that does not need calibration or adjustment to maintain uniformity of the electromagnetic field is desirable to reduce maintenance cost.

SUMMARY

In accordance with an embodiment, an antenna for plasma processing includes: an inner structure; an outer structure; and a plurality of interconnecting structures coupling the inner structure to the outer structure, the plurality of interconnecting structures being axisymmetric with respect to a center of the antenna, and each interconnecting structure having an azimuthal component of at least 30 degrees.

In accordance with another embodiment, an antenna for plasma processing includes: a conductive inner structure; a conductive outer structure; and a conductive interconnecting structure coupling the conductive inner structure to the conductive outer structure, the conductive interconnecting structure having a plurality of axisymmetric cutouts, where each of the axisymmetric cutouts have a curved shape in a top view.

In accordance with yet another embodiment, an apparatus for a plasma processing system includes: a radiating structure couplable to a current feed, the radiating structure being a conductive plate with a plurality of axisymmetric cutouts, where the axisymmetric cutouts have respective azimuthal components of at least 30 degrees; a plasma chamber coupled to the radiating structure; and a dielectric structure, the dielectric structure being disposed between the radiating structure and the plasma chamber.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present disclosure and the advantages thereof, reference is now made to the following descriptions taken in conjunction with the accompanying drawings, in which.

Figure 1:
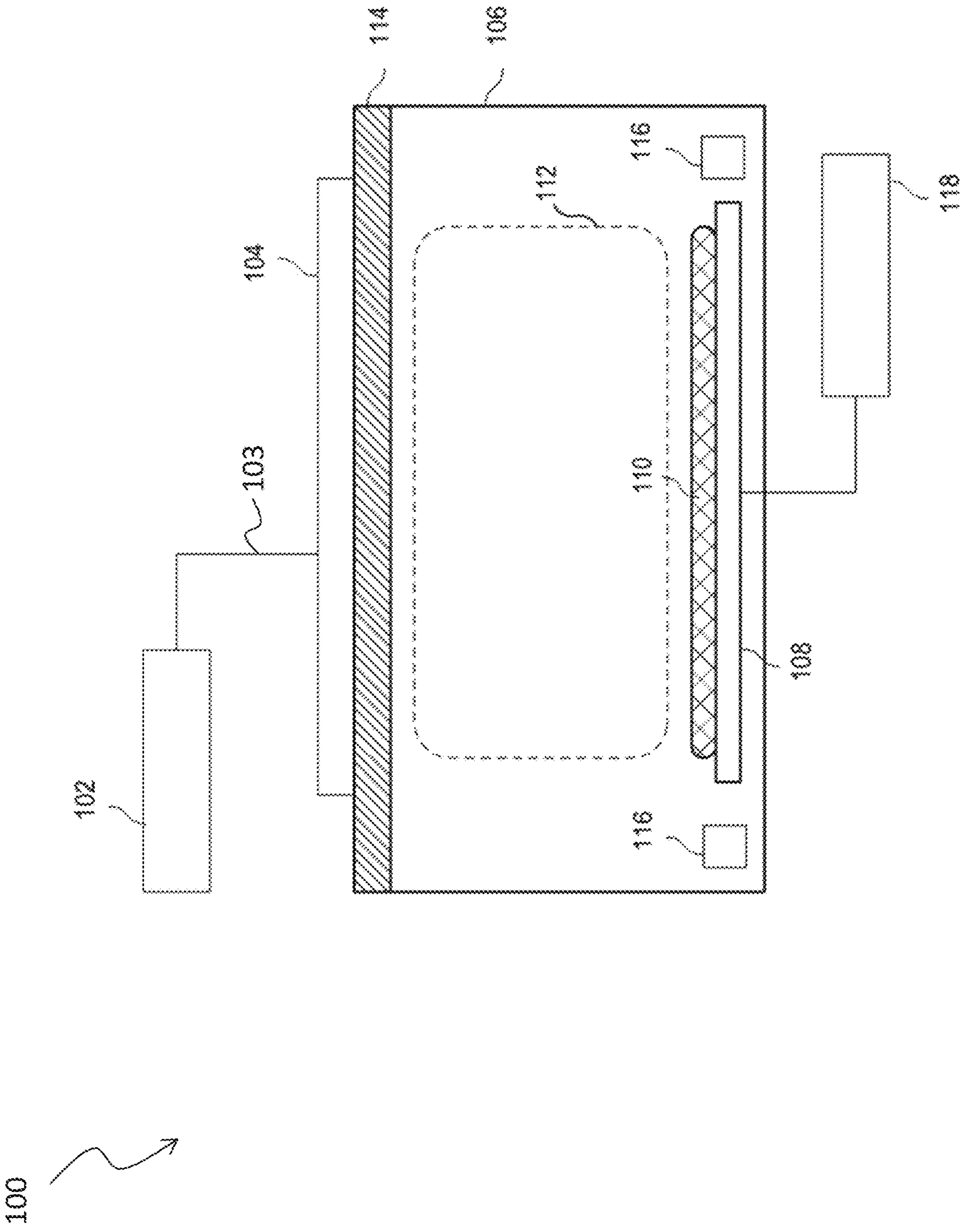
FIG. 1 is a diagram of an embodiment plasma processing system.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

While inventive aspects are described primarily in the context of radiating structures in a plasma processing system, the inventive aspects may be similarly applicable to fields outside the semiconductor industry. Plasma can be used to treat and modify surface properties through functional group addition. For example, to treat surfaces for paint deposit, plasma can convert hydrophobic surfaces to hydrophilic surfaces. Further, the inventive aspects are not limited to plasma. For example, RF can be used to thaw out frozen food or dry out textiles, food, wood, or the like. In these various examples and across industries, a uniform oscillating magnetic field as disclosed herein is advantageous.

The references used herein are provided merely for convenience and hence do not define the extent of protection or the scope of the embodiments. According to one or more embodiments of the present disclosure, plasma generation systems may include radiating structures (also referred to as antennas or plate antennas) that are rigid, unibody structures with discrete axial symmetry (e.g., n-fold symmetry with respect to rotations of an angle 360°/n around a central axis where n is an integer). It is desirable to use rigid, unibody radiating structures to generate uniform plasma fields because the rigid, unibody radiating structures maintain their shape and relative position with respect to the plasma generation system. This can reduce the time needed to orient or calibrate the radiating structures, thus saving time-related costs. In embodiments, a unibody structure is a structure that is effectively a rigid single body. An example of a unibody structure is a structure machined from a single piece of metal stock. However, unibody structures may also be manufactured by joining together subparts using either physical or chemical methods to achieve a rigid single structure.

FIG. 1 illustrates a diagram of an embodiment plasma processing system 100.

Plasma processing system 100 includes an RF source 102 (also referred to as an RF generator), a radiating structure 104, a plasma chamber 106, and, optionally, a dielectric plate 114 (also referred to as a dielectric structure), which may (or may not) be arranged as shown in FIG. 1. In some embodiments, the dielectric structure includes air. Further, plasma processing system 100 may include additional components not depicted in FIG. 1.

In embodiments, RF source 102 includes an RF power supply, which may include a generator circuit and a matching circuit (not shown). RF source 102 is coupled to the radiating structure 104 via a feeding structure 103. The RF source 102 provides forward RF waves to the radiating structure 104. The forward RF waves are transmitted (i.e., radiated) by the radiating structure 104 towards plasma chamber 106.

In embodiments, the feeding structure 103 may include a power transmission line, such as a coaxial cable or the like, an interface with conductive offsets 712 and conductive offsets 732 (see below, FIG. 7), the like, or a combination thereof.

Plasma chamber 106 includes a substrate holder 108. As shown, substrate 110 is placed on substrate holder 108 to be processed. Optionally, plasma chamber 106 may include a bias power supply 118 coupled to substrate holder 108. The plasma chamber 106 may also include one or more pump outlets 116 to remove by-products from plasma chamber 106 through selective control of gas flowrates within. In embodiments, pump outlets 116 are placed near (e.g., below/around the perimeter of) substrate holder 108 and substrate 110.

In embodiments, radiating structure 104 is separated from plasma chamber 106 by the dielectric plate 114, which is made of a dielectric material. Dielectric plate 114 separates the low-pressure environment within plasma chamber 106 from the external atmosphere. It should be appreciated that radiating structure 104 can be placed directly adjacent to plasma chamber 106, or radiating structure 104 can be separated from plasma chamber 106 by air. In embodiments, the dielectric plate 114 is selected to minimize reflections of the RF wave from the plasma chamber 106. In other embodiments, the radiating structure 104 is embedded within the dielectric plate 114.

In an embodiment, the radiating structure 104 couples RF power from RF source 102 to the plasma chamber 106 to treat the substrate 110. In particular, the radiating structure 104 radiates an electromagnetic wave in response to being fed the forward RF waves from the RF source 102. The radiated electromagnetic wave penetrates from the atmospheric side (i.e., radiating structure 104 side) of the dielectric plate 114 into plasma chamber 106. The radiated electromagnetic wave generates an electromagnetic field within the plasma chamber 106. The generated electromagnetic field ignites and sustains plasma 112 by transferring energy to free electrons within the plasma chamber 106. The plasma 112 can be used to, for example, selectively etch or deposit material on substrate 110.

In FIG. 1, radiating structure 104 is shown to be external to plasma chamber 106. In embodiments, however, radiating structure 104 can be placed internal to the plasma chamber 106.

Figure 2:
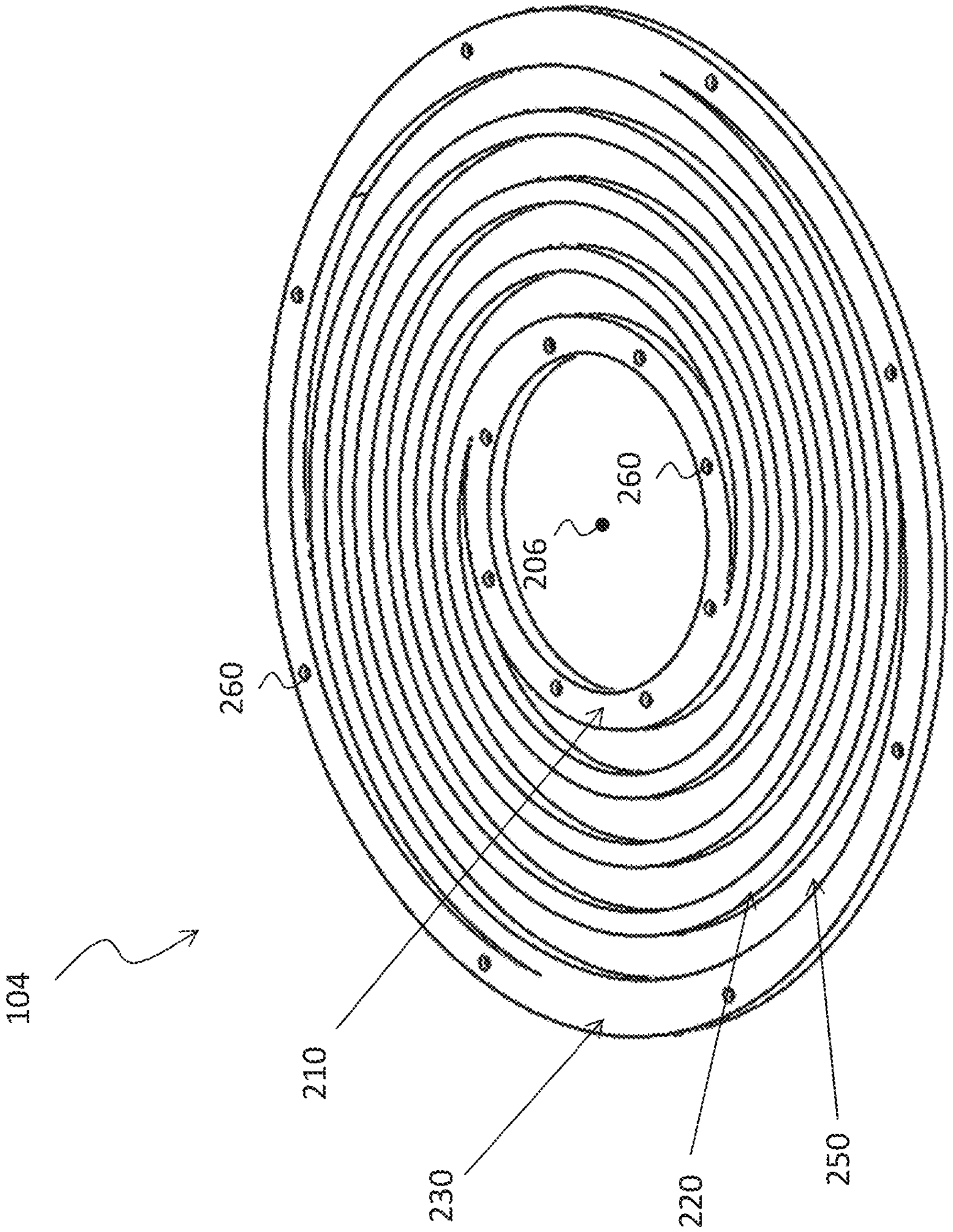
FIG. 2 is a perspective view of an embodiment radiating structure.

FIG. 2 illustrates a perspective view of the radiating structure 104, in accordance with some embodiments. The radiating structure 104 may also be referred to as an antenna or an antenna plate.

It is advantageous for antennas of inductively coupled plasma (ICP) or capacitively coupled plasma (CCP) systems to have discrete axial symmetry to provide uniformity in the generated plasma.

In embodiments, the radiating structure 104 is formed as having a unibody structure with rigidity. Thus, the radiating structure 104 may be manufactured with increased consistency in shape and size between different radiating structures 104.

For example, the radiating structure 104 may be machined out of a single plate of conductive material, which may increase the repeatability of the process. The radiating structure 104 may be subject to reduced distortions during installation into, for example, plasma processing systems 100, due to being rigid unibodies. This may decrease the time for the calibration of the radiating structure 104 after installation.

In embodiments, the radiating structure 104 is a conductive plate comprising copper, aluminum, iron, nickel, cobalt, the like, or a combination thereof.

In some embodiments, the radiating structure 104 has a vertical thickness greater than 10 mm, which may be useful to avoid deformation during installation.

In some embodiments, conductive portions of the radiating structure 104 have a vertical thickness less than 10 mm, such as in a range of 2 mm to 5 mm. In embodiments, the radiating structure 104 includes conductive portions mounted on a support structure that is a dielectric material (e.g., a plastic or the like). For example, the radiating structure 104 may be a metal layer bonded to a PC board, where the PC board is the dielectric support structure. The support structure provides increased rigidity, which may increase the repeatability of the process and avoid deformation during installation.

In embodiments, the support structure has a vertical thickness in a range of at least 5 mm, such as 5 mm to 8 mm. The radiating structure 104 may be attached mechanically or chemically to the support structure. This may be advantageous for increasing repeatability of the manufacturing process of the radiating structure 104 while decreasing cost. For example, the conductive portions of the radiating structure 104 may be formed using photographic techniques to achieve very high repeatability and accuracy, while the dielectric support structure (e.g., plastic) has a greater vertical thickness and can be manufactured with less precision than the conductive portions of the radiating structure.

In embodiments, the radiating structure 104 includes an inner ring 210 (also referred to as an inner structure), an outer ring 230 (also referred to as an outer structure), and two spiral arms 220 (also referred to as radiative elements or interconnecting structures) between the inner ring 210 and the outer ring 230. The spiral arms 220 are separated by slits 250 (also referred to as cutouts or axisymmetric cutouts), which may be filled with air, vacuum, or a dielectric material.

As shown in FIG. 2, the spiral arms 220 include two Archimedean spirals. It should be appreciated the number of spiral arms and the type of spirals (e.g., Archimedean spirals) are non-limiting, and additional spiral arms and types may similarly be employed.

In embodiments, the spiral arms 220 have discrete axial symmetry to generate an azimuthally symmetric, high-density plasma 112 (see above, FIG. 1). The plasma 112 may be generated with predominantly inductively coupled electric fields or with predominantly capacitively coupled electric fields. Inputs and outputs for generating the electromagnetic field are connected to the inner ring 210 and the outer ring 230. In an embodiment, one or more current feeds are connected to the inner ring 210, and one or more current feeds are connected to the outer ring 230.

For example, in a case where the radiating structure 104 has two spiral arms 220 as illustrated in FIG. 2, a first current feed is connected to the inner ring 210 where a first spiral arm 220 meets the inner ring 210, a second current feed is connected to the inner ring 210 where a second spiral arm 220 meets the inner ring 210, a third current feed is connected to the outer ring 230 where the first spiral arm 220 meets the outer ring 230, and a fourth current feed is connected to the outer ring 230 where the second spiral arm 220 meets the outer ring 230.

In an embodiment, the first current feed and the second current feed are driven (e.g., connected to respective current inputs), and the third current feed and the fourth current feed are connected to reference ground, either directly or through a capacitor that may be variable.

In an embodiment, the first current feed and the second current feed are connected to reference ground, either directly or through a capacitor that may be variable, and the third current feed and the fourth current feed are driven (e.g., connected to respective current inputs). In embodiments, the relative phase of the current drive of the first and second current feeds relative to the third and fourth current feeds is 180 degrees while the amplitudes are the same. Such embodiments increase the inductive fields produced by the radiating structure 104. In other embodiments, the relative phase and relative amplitude have different values in order to sinusoidally vary the charge on the radiating structure 104 and hence its capacitive coupling with the plasma.

In an embodiment, the first current feed and the second current feed are driven (e.g., connected to respective current inputs), and the third current feed and the fourth current feed are left free of electrical connections so that the inner ring 210 is coupled to current inputs and the outer ring 230 is free of electrical connections external to the radiating structure 104. Leaving the outer ring 230 free of electrical connections may be advantageous for low pressure striking.

In embodiments, the slits 250 continuously wind from the inner ring 210 to the outer ring 230. The slits 250 may have azimuthal components of at least 30 degrees. In embodiments, the slits 250 have the same shape and occupy the same volume. The length of the slits 250 may be less than one half the wavelength of the electromagnetic radiation generated by the radiating structure 104. For example, when the excitation frequency of the radiating structure 104 is in a range of 5 MHz to 100 MHz, the length of the slits 250 may be in a range of 20 m to 1 m. The length of the slits 250 may be smaller depending on the details of the circuit powering the radiating structure 104 (see below, FIG. 9). For example, with capacitors added to ends of the circuit powering the radiating structure 104, the length of the slits 250 may be $1/10^{th}$ of the electromagnetic radiation generated by the radiating structure 104.

In embodiments, the slits 250 are separated from each other by the spiral arms 220, and the slits 250 do not connect with each other across the spiral arms 220, the inner ring 210, or the outer ring 230. In some embodiments, both ends of the slits 250 are closed. In other embodiments, at least one end of the slits 250 is open.

In some embodiments, mounting points 260 are placed in the inner ring 210, the outer ring 230, or both. The mounting points 260 may be used to couple power supply rods or antenna supports to the inner ring 210 or the outer ring 230. The mounting points 260 may be placed equidistantly along the inner ring 210 and the outer ring 230, spaced equidistantly from respective inner and outer edges of the inner ring 210 or the outer ring 230. However, any suitable pattern for the mounting points 260 may be used. In other embodiments, the radiating structure 104 is free of mounting points and is secured to antenna supports or power supply rods by other means, such as clamps, soldering, or the like.

In embodiments, the radiating structure 104 radiates an electromagnetic field towards the plasma chamber 106, which generates an azimuthally symmetric, high-density plasma 112 (see above, FIG. 1) with predominantly inductively coupled electric fields or with predominantly capacitively coupled electric fields.

In an embodiment, the radiating structure 104 includes spiral arms 220 that generate the azimuthal symmetry, as disclosed herein.

In embodiments, the excitation frequency of the radiating structure 104 is in the radio frequency range (e.g., $10^{-400}$ MHZ, such as 13 MHz), which is not limiting, and other frequency ranges can similarly be contemplated (e.g., a range of 5 MHz to 100 MHz). For example, inventive aspects disclosed herein are equally applicable to applications in the microwave frequency range.

In embodiments, the operating frequency of radiating structure 104 is in a range of 5 to 100 megahertz (MHz). In embodiments, the power delivered by radiating structure 104 ranges from 10 to 5000 Watts (W)—determined by various factors such as distance from the radiating structure 104, impedance values, or the like.

In embodiments, the radiating structure 104 includes radiative elements (e.g., the spiral arms 220). The radiative elements can be elements with discrete axially symmetric arms that are electrically connected to the RF source 102.

In embodiments, the radiative elements have the same shape and are disposed about a central axis such that there is an N-fold symmetry upon rotation, where N is an integer greater than 1.

In embodiments, the elements of the radiating structure 104 where the magnetic field is high and the elements of the radiating structure 104 where the electric field is high are arranged about a central axis of symmetry. In an embodiment, the central axis of symmetry is perpendicular to the dielectric plate 114 (see above, FIG. 1). In an embodiment where the dielectric plate 114 is in the shape of a disk, the central axis of symmetry passes through the center of the disk. The elements of the radiating structure 104 are arranged such that the geometry is unchanged upon rotation of all the elements about the axis of symmetry by an angle which is equal to 2× divided by an integer greater than 1.

In embodiments, the radiating structure 104 is a conductive, planar, closed ring structure with a plurality of spiral arms 220. The spiral arms 220 have n-fold symmetry about an axis which passes through a center point 206 of the radiating structure 104. In FIG. 2, the number of spiral arms 220 is shown to be two; however, the number of spiral arms 220 is non-limiting and can be any number greater than one (e.g., two to sixteen).

In embodiments, radiating structure 104 is a monolithic structure. In such an embodiment, the radiating structure 104 includes a closed inner ring 210 and a closed outer ring 230, which provide mechanical connections to hold the spiral arms 220 into a single unit.

In embodiments, the radiating structure 104 is a conductive plate with a plurality of axisymmetric spiral cutouts that form the plurality of spiral arms 220. In embodiments where the radiating structure 104 is formed from a conductive plate, the assembly and mechanical inconsistencies of the radiating structure are minimized due to the generally tight tolerances in the fabrication and manufacturing of the radiating structure 104. Advantageously, such a structure provides for more robust and repeatable electromagnetic waves. Furthermore, the radiating structure 104 design provides for scaling to accommodate multiple radial zones with respect to the generated electromagnetic fields.

In embodiments, the boundaries of the spiral arms 220 with the inner ring 210 are symmetric around the inner ring 210, and the boundaries of the spiral arms 220 with the outer ring 230 are symmetric around the outer ring 230.

In embodiments, respective ends of each spiral arm 220, as measured from a center of each spiral arm 220, have different radii.

In embodiments, each spiral arm 220 has a straight line distance between its ends. In such an embodiment, a straight line distance of a majority of the spiral arms 220 is of the same or a similar length.

In embodiments, the endpoints where each spiral arm 220 meet the outer ring 230 are disposed at different angles measured from the center point 206 of the radiating structure 104 to a tangential line at the endpoint (i.e., at the outer ring).

In embodiments, the arrangement of spiral arms 220 includes arranging the spiral arms 220 such that geometry of the spiral arms 220 is unchanged during a rotation of all the spiral arms 220 about an axis of symmetry by an angle equal to 2× divided by an integer greater than 2. In an exemplary embodiment, the integer is equal to eight.

In embodiments, the radiating structure 104 is semi-axisymmetric.

As shown, the spiral arms 220 have a design corresponding to Archimedean spirals forming a spiral antenna. However, the design of the radiating structure 104 is non-limiting. For example, in embodiments, the spiral arms 220 can be in the shape of logarithmic spirals forming a spiral antenna.

In embodiments, the radiating structures disclosed herein provide a uniform electromagnetic field within the plasma chamber 106. The uniform electromagnetic field provides for a uniform distribution of the density of the plasma 112 and, thus, uniform substrate treatment within.

In embodiments, the spiral arms 220 geometrically wind in a radial and azimuthal manner. In embodiments, the spiral arms 220 are positioned in a nested manner.

In embodiments, each of the spiral arms 220 has the same shape, length, and volume as the rest of the spiral arms 220.

The radiating structure 104 may be manufactured by one or more manufacturing techniques, such as machining, casting, etching, electroforming, 3D metal printing, or a combination thereof. Different manufacturing techniques may provide different benefits such as desired plate thickness of the radiating structure 104, materials or coatings used, and properties such as shape, weight, thermal expansion, or the like.

In some embodiments, the radiating structure 104 is manufactured by a machining process. Machining is used to cut a metal plate to a desired thickness and remove portions to form a desired pattern (e.g., a pattern of a radiating structure illustrated in FIGS. 2-6). In some embodiments, a radiating structure 104 formed by machining may have a thickness in a range of 2 mm to 20 mm, and the radiating structure 104 may be mounted on a dielectric support structure to provide augmented mechanical rigidity.

In some embodiments, machining is used to form the radiating structure 104 from copper or copper alloy. Using copper or copper alloy for the machining process can provide a radiating structure 104 with a precise shape and high conductivity, such as a conductivity in a range of $4\times10^{7}$ S/m to $6\times10^{7}$ S/m, or a conductivity in a range of 100% IACS to 50% IACS.

In some embodiments, machining is used to form the radiating structure 104 from aluminum or aluminum alloy. Using aluminum or aluminum alloy for the machining process may provide a radiating structure 104 with a precise shape and low weight due to the low density of aluminum. For example, the weight of the radiating structure 104 may be in a range of 2 kg to 4 kg, or the specific density of the radiating structure material may be in a range of 2.6 to 2.8.

In some embodiments, machining is used to form the radiating structure 104 from iron-nickel alloy or iron-nickel-cobalt alloy. Using iron-nickel alloy or iron-nickel-cobalt alloy for the machining process may provide a radiating structure 104 with a precise shape and low thermal expansion, such as a thermal expansion in a range of $10\times10^{-6}$ m/(m-C) to $15\times10^{-6}$ m/(m-C), or in a range of o/K to $5\times10^{-6}$/K. Additionally, using iron-nickel alloy or iron-nickel-cobalt alloy for the machining process may allow for a plating of the radiating structure 104 with, for example, a gold or silver coating to be applied with a suitable technique such as electroplating or electroless plating.

In some embodiments, the radiating structure 104 is manufactured by a casting process. Molten metal is poured into a mold with a desired pattern to form a radiating structure with a desired shape (e.g., a pattern of a radiating structure illustrated in FIGS. 2-6). Casting may be less expensive than other manufacturing techniques such as machining, etching, electroforming, or the like. In some embodiments, a radiating structure 104 formed by casting may have a thickness in a range of 3 mm to 25 mm, and the radiating structure 104 may be mounted on a dielectric support structure to provide augmented mechanical rigidity.

In some embodiments, casting is used to form the radiating structure 104 from copper alloy. Using copper alloy for the casting process may provide a radiating structure 104 for low cost and with high conductivity, such as the conductivity described above with respect to a radiating structure formed using machining on copper alloy.

In some embodiments, casting is used to form the radiating structure 104 from aluminum alloy. Using aluminum alloy for the casting process may provide a radiating structure 104 for low cost and with low weight due to the low density of aluminum, such as the weight described above with respect to a radiating structure formed using machining on aluminum or aluminum alloy.

In some embodiments, casting is used to form the radiating structure 104 from iron-nickel alloy or iron-nickel-cobalt alloy. Using iron-nickel alloy or iron-nickel-cobalt alloy for the casting process may provide a radiating structure 104 for low cost and with low thermal expansion, such as the thermal expansion described above with respect to a radiating structure formed using machining on iron-nickel alloy or iron-nickel-cobalt alloy. Additionally, using iron-nickel alloy or iron-nickel-cobalt alloy for the casting process may allow for a plating of the radiating structure 104 with, for example, a gold or silver coating to be applied with a suitable technique such as electroplating or electroless plating.

In some embodiments, the radiating structure 104 is manufactured by an etching process. A desired pattern to form a radiating structure with a desired shape (e.g., a pattern of a radiating structure illustrated in FIGS. 2-6) is printed onto a photoresist (e.g., by exposure to light) over a thin metal plate. The areas of the photoresist not exposed are removed to expose regions of the metal plate, and the exposed regions of the metal plate are then removed with a suitable etchant (e.g., a wet etch with an acidic solution). Etching may be useful for forming a thinner radiating structure than other manufacturing techniques such as machining, casting, electroforming, or the like. In some embodiments, a radiating structure 104 formed by etching may have a thickness in a range of 0.1 mm to 2 mm, and the radiating structure 104 is mounted on a dielectric support structure to provide mechanical rigidity.

In some embodiments, etching is used to form the radiating structure 104 from copper alloy. Using copper alloy for the etching process may provide a radiating structure 104 with smaller thickness and high conductivity, such as the conductivity described above with respect to a radiating structure formed using machining on copper or copper alloy.

In some embodiments, etching is used to form the radiating structure 104 from aluminum alloy. Using aluminum alloy for the etching process may provide a radiating structure 104 with smaller thickness and low weight due to the low density of aluminum, such as the weight described above with respect to a radiating structure formed using machining on aluminum or aluminum alloy.

In some embodiments, etching is used to form the radiating structure 104 from iron-nickel alloy or iron-nickel-cobalt alloy. Using iron-nickel alloy or iron-nickel-cobalt alloy for the etching process may provide a radiating structure 104 with smaller thickness and low thermal expansion, such as the thermal expansion described above with respect to a radiating structure formed using machining on iron-nickel alloy or iron-nickel-cobalt alloy. Additionally, using iron-nickel alloy or iron-nickel-cobalt alloy for the etching process may allow for a plating of the radiating structure 104 with, for example, a gold or silver coating to be applied with a suitable technique such as electroplating or electroless plating.

In some embodiments, the radiating structure 104 is manufactured by an electroforming process. In electroforming, a desired thickness of a metal is electrodeposited on a conductive model with a desired shape (e.g., a pattern of a radiating structure illustrated in FIGS. 2-6). In some embodiments, the conductive model is formed by manufacturing a desired shape out of a non-conductive material (e.g., plastic, glass, or the like) and then depositing a conductive layer on the non-conductive material. The conductive layer may be deposited chemically, with a vacuum deposition technique such as sputtering or the like. After the desired thickness of the metal is electrodeposited on the conductive model to form the radiating structure 104, the conductive model is removed from the electroformed radiating structure 104 with a mechanical or chemical parting method. In some embodiments, a radiating structure 104 formed by machining may have a thickness in a range of 0.1 mm to 3 mm, and the radiating structure 104 may be mounted on a dielectric support structure to provide augmented mechanical rigidity.

In some embodiments, electroforming is used to form the radiating structure 104 with copper alloy. This may provide a radiating structure 104 with smaller thickness, precise shape, and high conductivity, such as the conductivity described above with respect to a radiating structure formed using machining on copper or copper alloy.

In some embodiments, electroforming is used to form the radiating structure 104 with aluminum alloy. This may provide a radiating structure 104 with smaller thickness, precise shape, and low weight due to the low density of aluminum, such as the weight described above with respect to a radiating structure formed using machining on aluminum or aluminum alloy.

In some embodiments, electroforming is used to form the radiating structure 104 with iron-nickel alloy or iron-nickel-cobalt alloy. This may provide a radiating structure 104 with smaller thickness, precise shape, and low thermal expansion, such as the thermal expansion described above with respect to a radiating structure formed using machining on iron-nickel alloy or iron-nickel-cobalt alloy. Additionally, forming iron-nickel alloy or iron-nickel-cobalt alloy with the electroforming process may allow for a plating of the radiating structure 104 with, for example, a gold or silver coating to be applied with a suitable technique such as electroplating or electroless plating.

In some embodiments, the radiating structure 104 is manufactured by a 3D metal printing process. 3D metal printing may enable complexity in the pattern of the radiating structure 104 without increasing costs, such as for making cooling channels in the radiating structure 104.

Radiating structures of this disclosure (e.g., the radiating structure 104 as illustrated in FIG. 2) may be distinguished from other structures such as Faraday shields. Generally, Faraday shields consist of metal plates with slits (e.g., slits with straight sidewalls) perpendicular to radio frequency current elements which may be located directly above the Faraday shields. The slits may extend from the centers of the plates to the edges of the plates. Faraday shields may be interposed between powered portions of antennas and plasma to reduce sheath electric fields (electric fields with polarizations perpendicular to the sheath edge). Faraday shields are typically grounded to be effective and, unlike radiating structures of this disclosure, are usually not driven by RF sources.

As described above, typical Faraday shields have straight slits extending from the centers of the Faraday shields to the edges of the Faraday shields. However, the radiating structures of this disclosure (e.g., the radiating structure 104) may have slits 250 with curved sidewalls (see above, FIG. 2) that have a significant azimuthal component, such as an azimuthal component of at least 30 degrees. This azimuthal component may be a significant difference between the radiating structures of this disclosure and typical Faraday shields.

Figure 3:
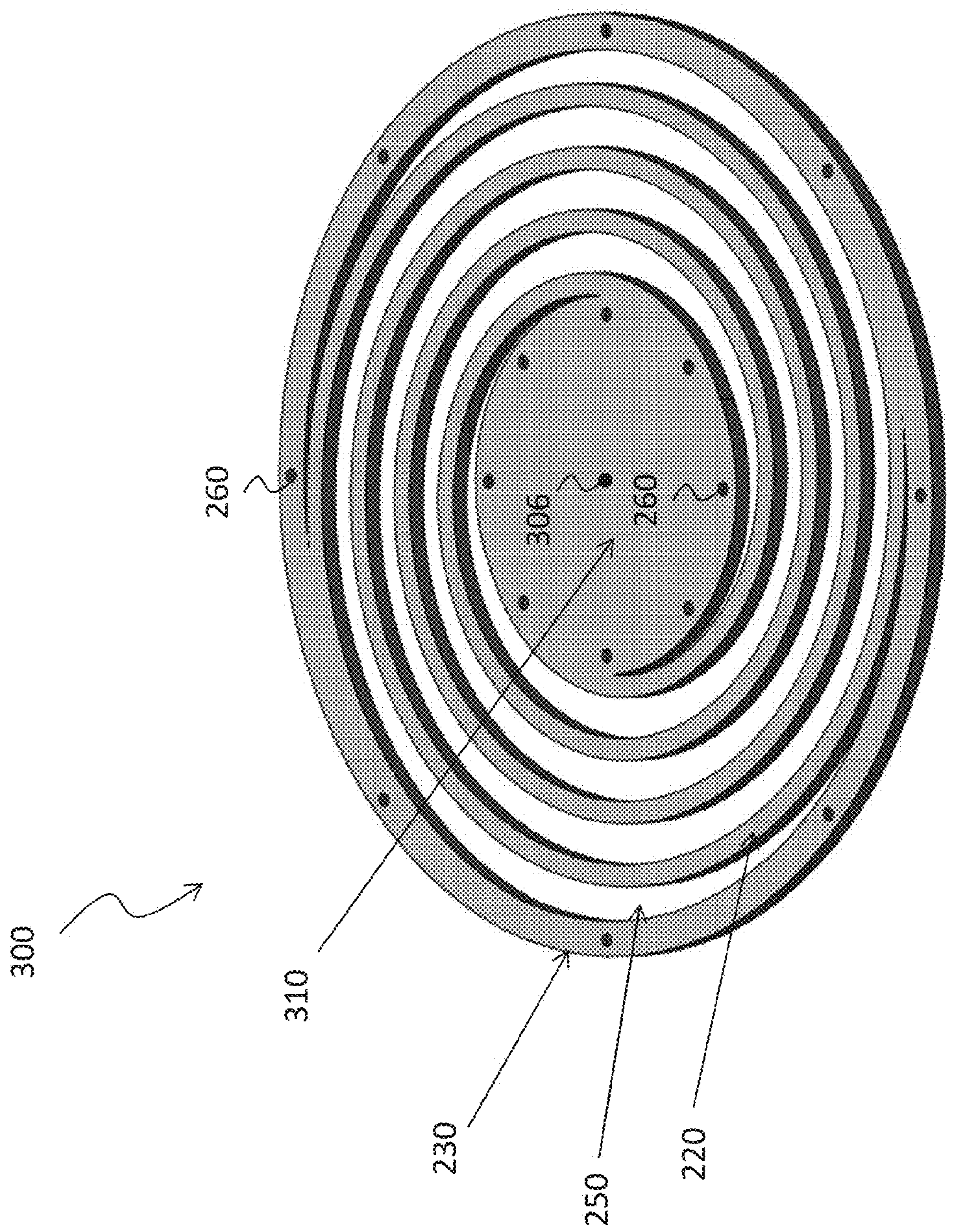
FIG. 3 is a perspective view of an embodiment radiating structure.

FIG. 3 illustrates a perspective view of a radiating structure 300, in accordance with some embodiments. The radiating structure 300 has a central disk 310 (also referred to as an inner structure) at the center of the radiating structure 300 connected to the spiral arms 220. In some embodiments, the central disk 310 is connected to a single current feed attached to, for example, the center 306 of the central disk 310.

Figure 4:
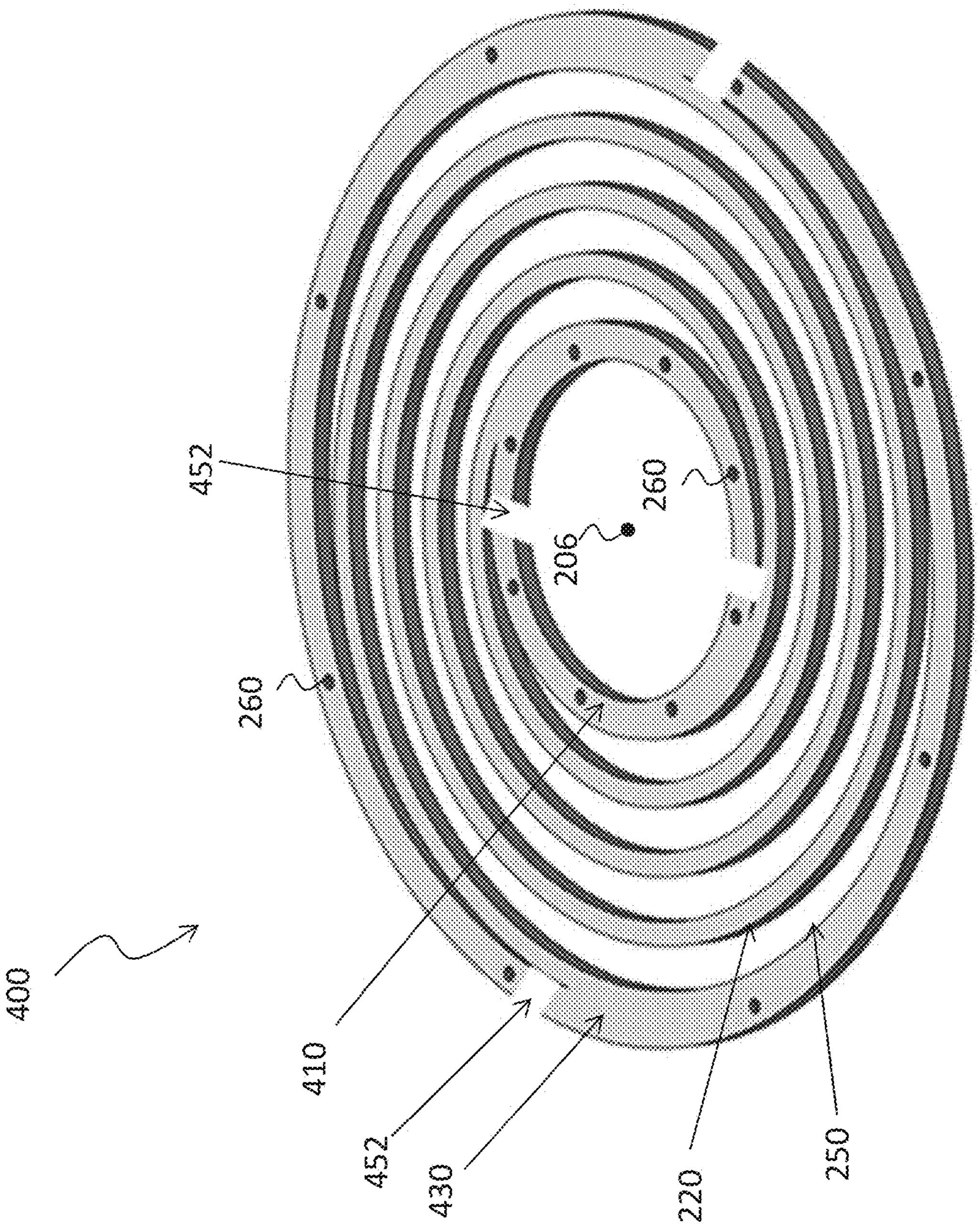
FIG. 4 is a perspective view of an embodiment radiating structure.

FIG. 4 illustrates a perspective view of a radiating structure 400, in accordance with some embodiments. In the radiating structure 400, the inner ring 410 and the outer ring 430 are separated by additional slits 452 so that each spiral arm 220 is separate (electrically isolated) from each other. This may be useful for restricting current to flow in a single azimuthal direction along each spiral arm 220 from one respective end of each spiral arm 220 to each respective opposite end, which may enable inductive coupling between the radiating structure 400 and the generated plasma 112 (see above, FIG. 1). Additional dielectric support may be used to keep the radiating structure 400 together as the additional slits 452 separate the spiral arms 220 and respective attached segments of the inner ring 410 and the outer ring 430 from each other. For example, the slits 250 or the additional slits 452 may be filled with a dielectric material.

Figure 5:
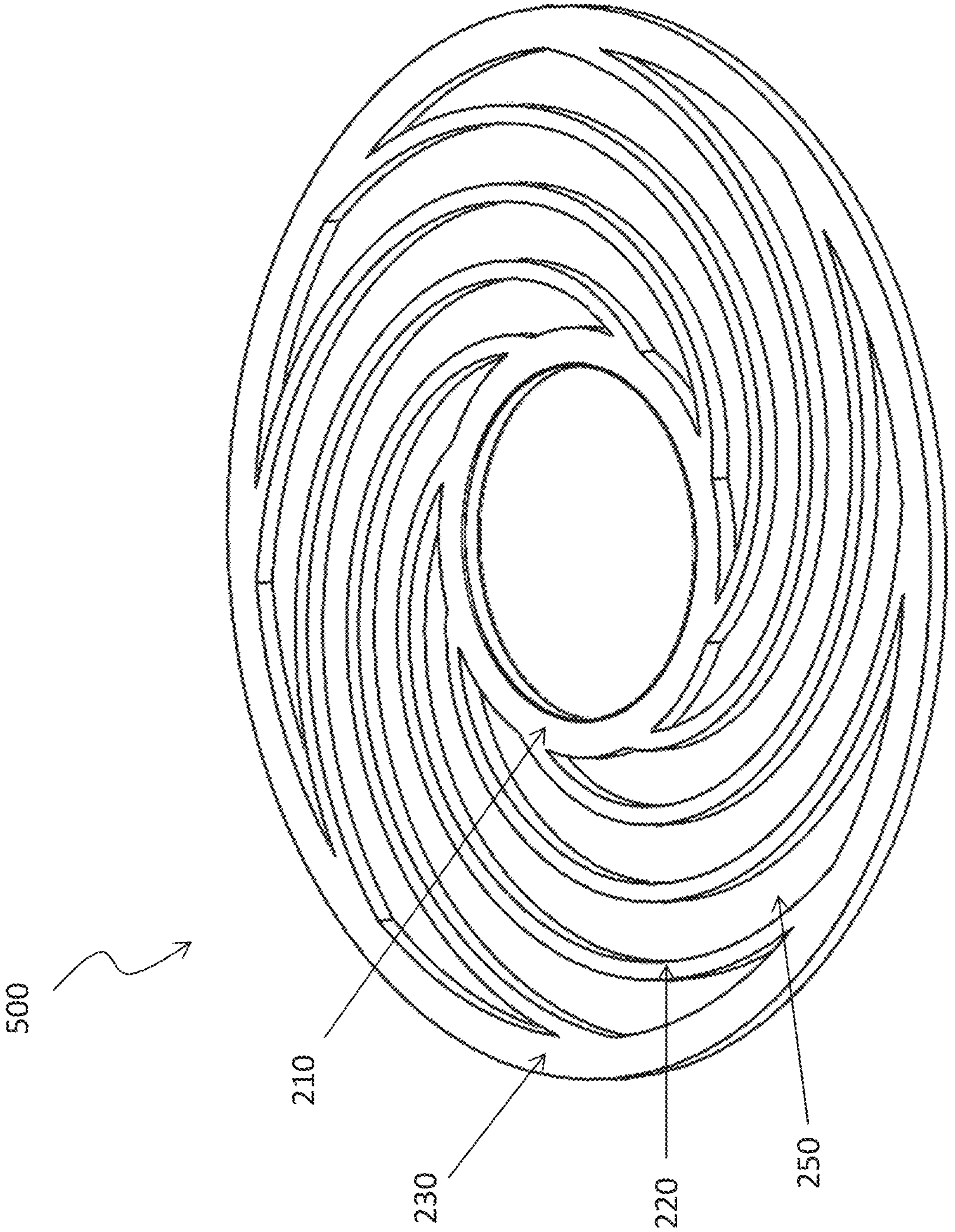
FIG. 5 is a perspective view of an embodiment radiating structure.

FIG. 5 illustrates a perspective view of a radiating structure 500 having an eight-fold symmetry arrangement, in accordance with some embodiments. The radiating structure 500 has eight spiral arms 220 extending between the inner ring 210 and the outer ring 230 of the radiating structure 500 and eight slits 250 between respective spiral arms 220. In other embodiments, radiating structure 500 may have any suitable number of spiral arms 220 and slits 250, such as 2 to 32 spiral arms 220 and slits 250. In some embodiments where the generated plasma is used to treat a substrate with a diameter of 300 mm, the number of spiral arms 220 is in a range between 2 and 16.

Figure 6:
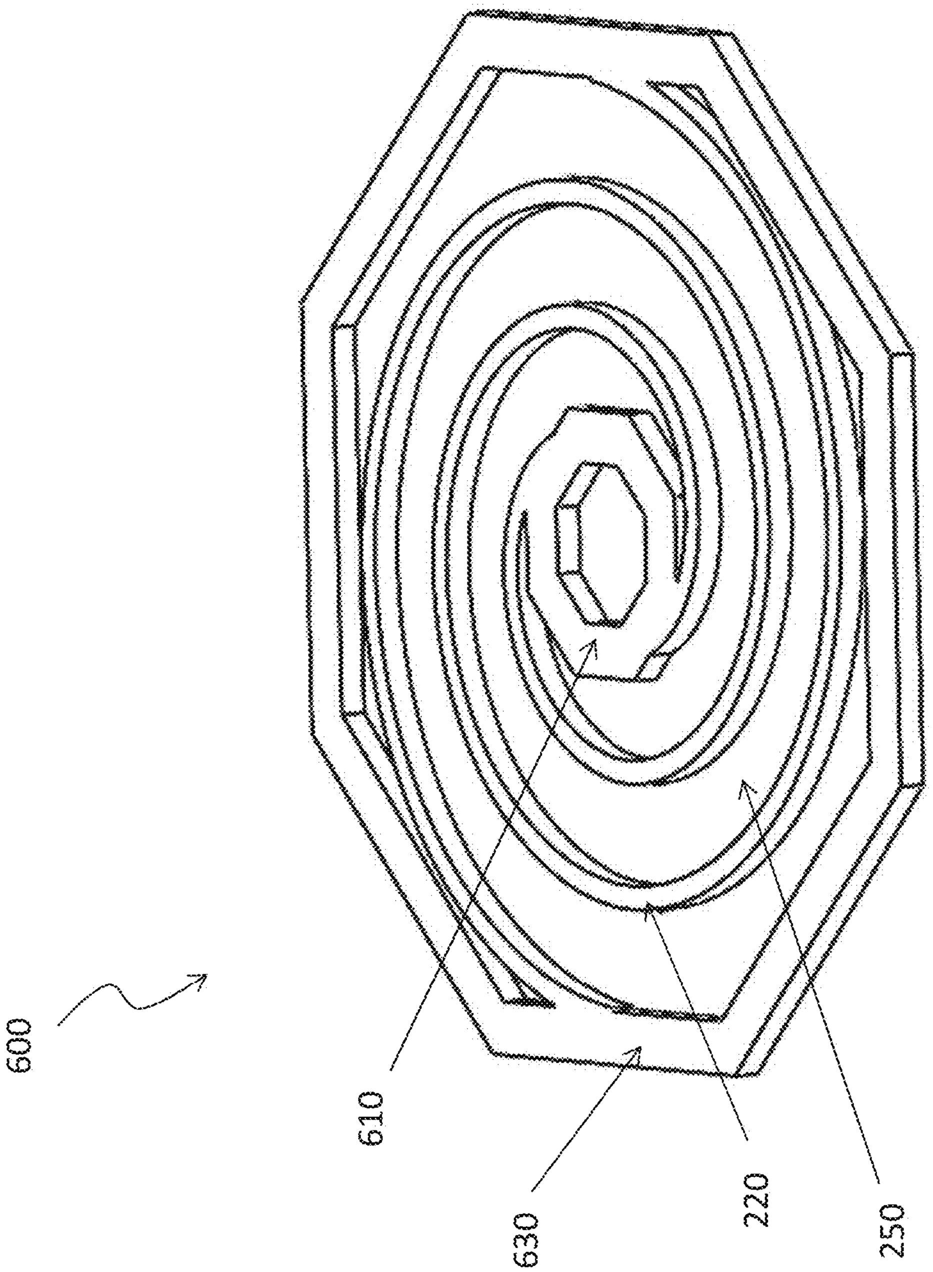
FIG. 6 is a perspective view of an embodiment radiating structure.

FIG. 6 illustrates a perspective view of a radiating structure 600, in accordance with some embodiments. In the radiating structure 600, the inner ring 610 and the outer ring 630 are polygons with straight sides. In the example illustrated by FIG. 6, the inner ring 610 and the outer ring 630 are octagons with eight sides each, but the inner ring 610 and the outer ring 630 may each have any suitable number of sides, such as three to twelve sides each. In some embodiments, the sides of the inner ring 610 and the outer ring 630. In other embodiments, the sides of the inner ring 610 and the outer ring 630 are curved.

In some embodiments, the radiating structure 600 has two spiral arms 220 and two slits 250 extending between the inner ring 610 and the outer ring 630. In other embodiments, the radiating structure 600 has any suitable number of spiral arms 220 and slits 250, such as 2 to 32 spiral arms 220 and slits 250. In some embodiments, the spiral arms 220 have curved sides. In other embodiments, the spiral arms 220 are made up of respective series of straight segments arranged in spiral patterns.

Figure 7:
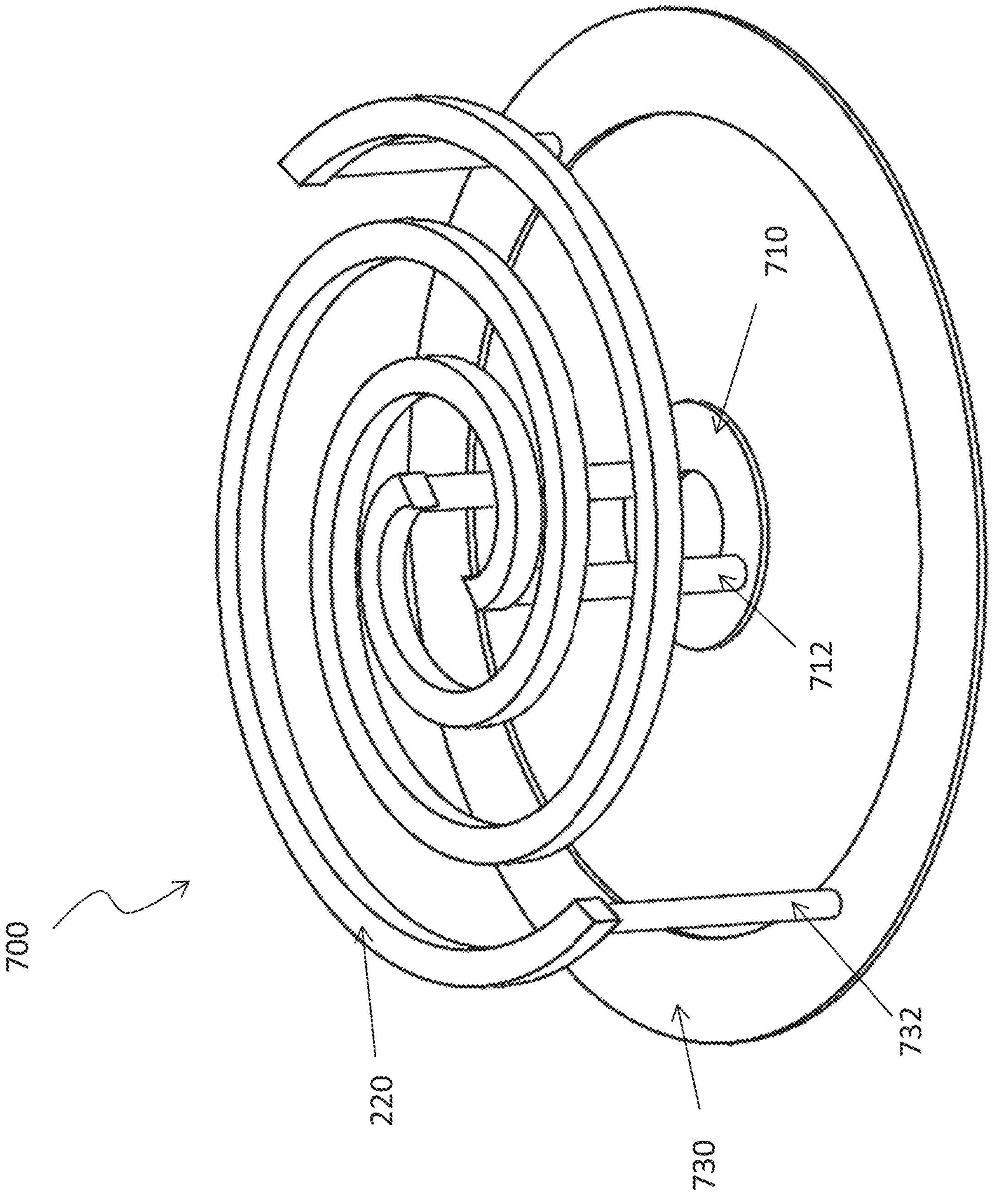
FIG. 7 is a perspective view of an embodiment radiating structure.

FIG. 7 illustrates a perspective view of a radiating structure 700, in accordance with some embodiments. The spiral arms 220 of the radiating structure 700 are located in a separate plane from the inner ring 710 and the outer ring 730. In some embodiments, the inner ring 710 is connected to each spiral arm 220 by respective conductive offsets 712, and the outer ring 730 is connected to each spiral arm 220 by respective conductive offsets 732. In some embodiments, the inner ring 710 and the outer ring 730 are located in the same plane. In other embodiments, the inner ring 710 and the outer ring 730 are located in different planes from each other and from the plane of the spiral arms 220.

Figure 8:
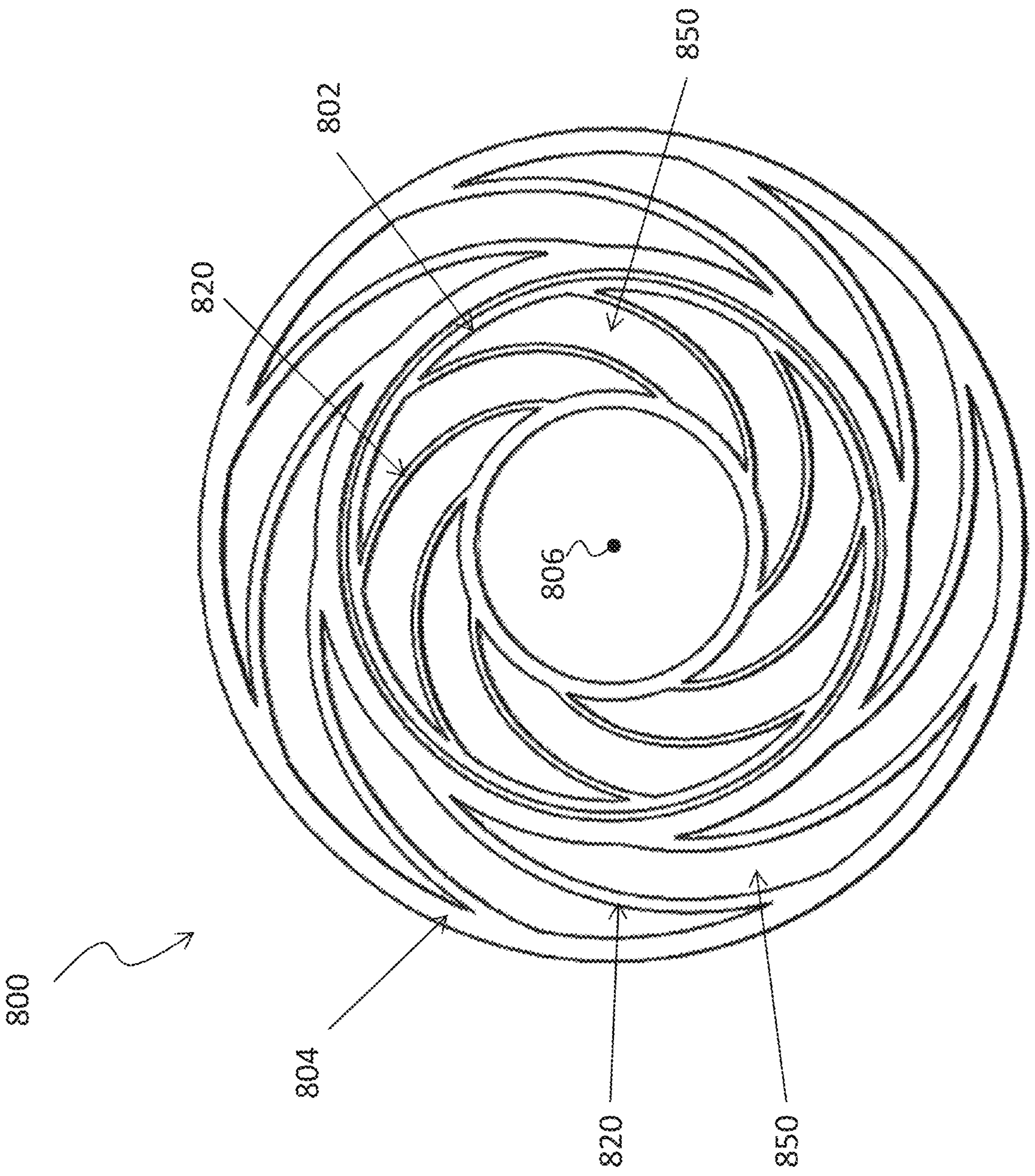
FIG. 8 is a top view of an embodiment radiating structure.

FIG. 8 illustrates a top view of an embodiment radiating structure 800 having an inner radiating structure 802 and an outer radiating structure 804. The inner radiating structure 802 and outer radiating structure 804 are concentric, conductive, ring structures with spiral cutouts 850 separating spiral arms 820. The inner radiating structure 802 is located within the inner ring cutout of the outer radiating structure 804. In some embodiments, the inner radiating structure 802 is on the same plane as the outer radiating structure 804 with the same center point 806. In other embodiments, the inner radiating structure 802 and the outer radiating structure 804 are on parallel planes with a separation in a range of, for example, 1 mm to 30 mm. A greater separation than 30 mm between the inner radiating structure 802 and the outer radiating structure 804 may be disadvantageous because the coupling of whichever one of the inner radiating structure 802 or the outer radiating structure 804 is farther from the plasma 112 (see above, FIG. 1) to the plasma 112 would be almost negligible.

Each of the inner radiating structure 802 and outer radiating structure 804 form a spiral antenna. Although the inner radiating structure 802 and outer radiating structure 804 are each illustrated as having eight spiral arms 820 and eight spiral cutouts 850, the inner radiating structure 802 and outer radiating structure 804 may have any suitable numbers of spiral arms 820 and spiral cutouts 850. For example, the inner radiating structure 802 may have two spiral arms 820 and two spiral cutouts 850 (see above, FIG. 2) and the outer radiating structure 804 may have eight spiral arms 820 and eight spiral cutouts 850.

Figure 9:
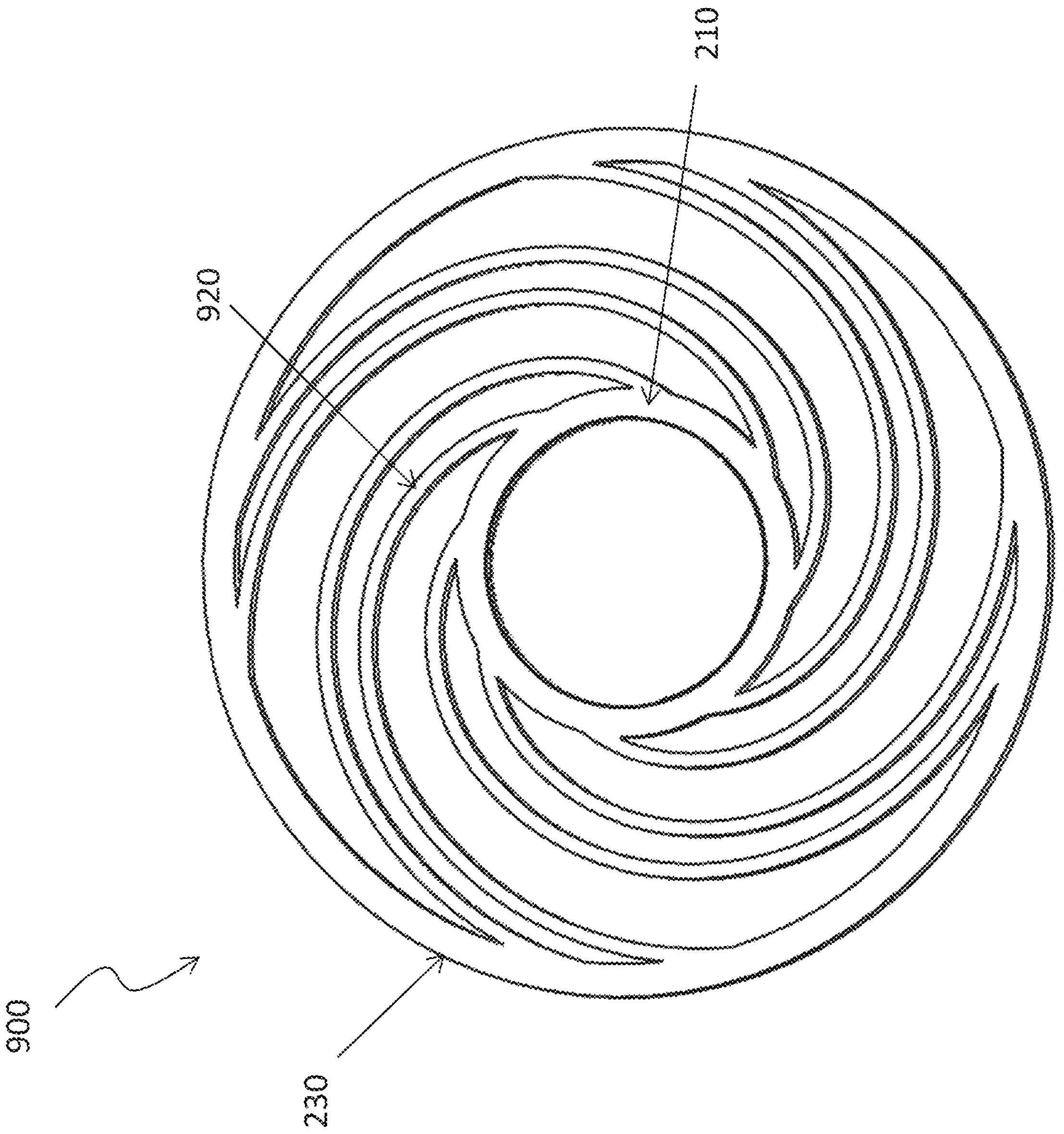
FIG. 9 is a top view of an embodiment radiating structure.

FIG. 9 illustrates a top view of an embodiment radiating structure 900 having eight spiral arms 920 at different radial angles, in accordance with some embodiments. A radial angle of a spiral arm 920 is measured between a first line and a second line, where the first line is between a center point of the spiral arm 920 and a meeting point of the spiral arm 920 with the inner ring 210 (i.e., tangential line at the meeting point) and the second line is tangent to the inner ring 210 at the meeting point.

In embodiments, the respective radial angles of each spiral arm 920 are in a range of 30° to 80°, which is advantageous for proper operation of the radiating structure 900 to generate a azimuthally symmetric, high-density plasma 112 (see above, FIG. 1). A radial angle of 30° or greater may provide an azimuthal component of the spiral arms 920 greater than the radial component of the spiral arms 920. This is advantageous for generating a toroidal-shaped plasma, which is efficient for inductively coupled plasma as it allows electrons to go around the toroidal plasma and reduces loss of electrons at the wall of the chamber 106.

As illustrated in FIG. 9, four of the spiral arms 920 have first radial angles and four of the spiral arms 920 have second radial angles larger than the first radial angles, and the spiral arms 920 having first radial angles alternate with the spiral arms 920 having second radial angles. It should be appreciated that FIG. 9 is an example, and the number of spiral arms 920 and the relative sizes and distributions of the radial angles are non-limiting. For example, the radiating structure 900 may have two spiral arms 920 at first radial angles, two spiral arms 920 at second radial angles larger than the first radial angles, and four spiral arms 920 at third radial angles smaller than the first radial angles. In other embodiments, respective radial angles of the spiral arms 920 are the same, such as is illustrated for spiral arms shown in FIGS. 2-8.

Figure 10:
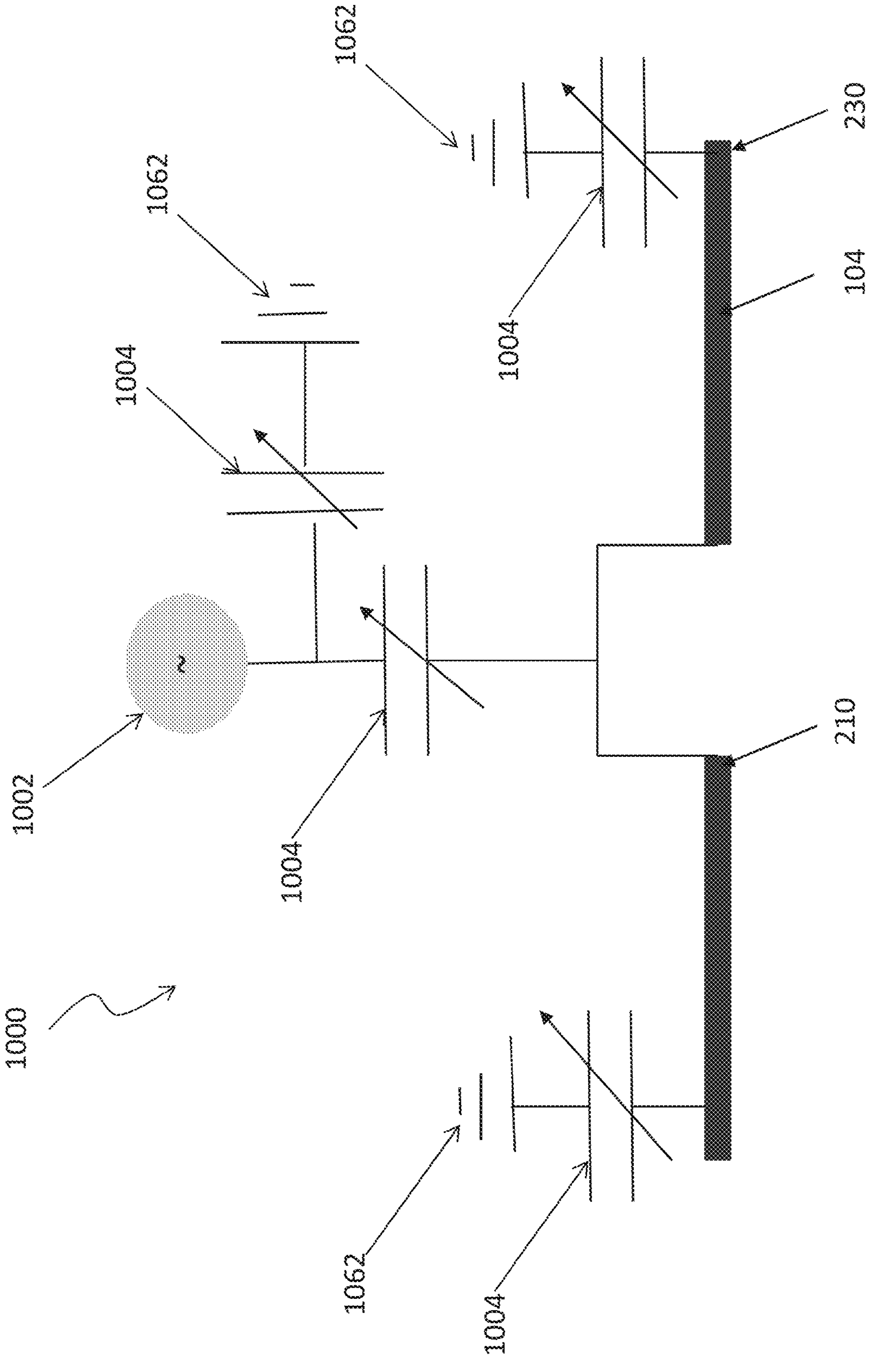
FIG. 10 is a schematic of an embodiment inductively coupled plasma structure.

FIG. 10 illustrates a schematic of an embodiment inductively coupled plasma structure 1000. The inductively coupled plasma structure 1000 includes an RF source 1002, capacitors 1004, and radiating structure 104, which may (or may not) be arranged as shown in FIG. 10. Here, RF source 1002 is shown as an AC power supply. In embodiments, the RF source 1002 is configured to provide a forward RF wave to the radiating structure 104. In embodiments, one or more of the capacitors 1004 are variable (e.g., varactors).

In embodiments, a matching network includes the RF source 1002 being coupled to the inner ring 210 of the radiating structure 104 across a capacitor 1004, the connection of the RF source 1002 to the capacitor 1004 being coupled to a reference ground across another capacitor 1004, and the outer ring 230 of the radiating structure 104 being coupled to a common RF ground 1062 across capacitors 904. The matching network transforms the impedance looking into the matching network, which is connected to the chamber 106 (see above, FIG. 1), to a same impedance as the RF generator (e.g., the RF source 1002) and the transmission lines between the RF source 902 and the radiating structure 104 (e.g., an impedance of 50 ohms). This enables the RF source 1002 to efficiently couple power to the radiating structure 104. The capacitors 1004 may also reduce noise in the circuit.

In other embodiments, the RF source 1002 is coupled to the outer ring 230 across a capacitor 1004 and the inner ring 210 is coupled to one or more common RF grounds 1062 across one or more respective capacitors 1004. The arrangement of the radiating structure 104 and the feed network is non-limiting, and the arrangement shown in FIG. 10 is to illustrate an example.

Example embodiments of the disclosure are summarized here. Other embodiments can also be understood from the entirety of the specification as well as the claims filed herein.

Example 1. An antenna for plasma processing, the antenna including: an inner structure; an outer structure; and a plurality of interconnecting structures coupling the inner structure to the outer structure, the plurality of interconnecting structures being axisymmetric with respect to a center of the antenna, and each interconnecting structure having an azimuthal component of at least 30 degrees.

Example 2. The antenna of example 1, where the antenna is inductively or capacitively couplable to a plasma chamber.

Example 3. The antenna of example 1, where a top-down view of the inner structure and the outer structure is a ring, a disk, a polygon, or a circle.

Example 4. The antenna of example 1, where the antenna is a rigid unibody structure.

Example 5. The antenna of example 1, where each interconnecting structure of the plurality of interconnecting structures is electrically isolated from the other interconnecting structures of the plurality of interconnecting structures.

Example 6. A system including the antenna of example 1, where the system includes: a radio frequency (RF) generator; a feeding structure coupling the RF generator to the antenna; and a plasma chamber coupled to the antenna.

Example 7. The antenna of example 1, where a resonant frequency of the antenna is between 5 and 100 megahertz (MHz).

Example 8. The antenna of example 7, where the length of the interconnecting structures is less than the ½ wavelength of the resonant frequency.

Example 9. The antenna of example 1, where the antenna includes multiple radial zones.

Example 10. An antenna for plasma processing, the antenna including: a conductive inner structure; a conductive outer structure; and a conductive interconnecting structure coupling the conductive inner structure to the conductive outer structure, the conductive interconnecting structure having a plurality of axisymmetric cutouts, where each of the axisymmetric cutouts have a curved shape in a top view.

Example 11. The antenna of example 10, where at least one of the conductive inner structure, the conductive outer structure, and the conductive interconnecting structure is on a different plane.

Example 12. The antenna of example 10, where one of the conductive inner structure or the conductive outer structure is coupled to a current source and the other one of the conductive inner structure or the conductive outer structure is coupled to a ground.

Example 13. The antenna of example 10, where one of the conductive inner structure or the conductive outer structure is coupled to a current source and the other one of the conductive inner structure or the conductive outer structure is free of electrical connections.

Example 14. The antenna of example 10, where the conductive inner structure is coupled to a first current source and the conductive outer structure is coupled to a second current source.

Example 15. An apparatus for a plasma processing system, the apparatus including: a radiating structure couplable to a current feed, the radiating structure being a conductive plate with a plurality of axisymmetric cutouts, where the axisymmetric cutouts have respective azimuthal components of at least 30 degrees; a plasma chamber coupled to the radiating structure; and a dielectric structure, the dielectric structure being disposed between the radiating structure and the plasma chamber.

Example 16. The apparatus of example 15, where the axisymmetric cutouts include spiral shapes.

Example 17. The apparatus of example 15, where the axisymmetric cutouts have an azimuthal component of at least 30 degrees.

Example 18. The apparatus of example 15, where the number of axisymmetric cutouts in the plurality of axisymmetric cutouts is in a range of two to sixteen.

Example 19. The apparatus of example 15, further including: a radio frequency (RF) generator; and a feeding structure coupling the RF generator to the radiating structure.

Example 20. The apparatus of example 15, where the radiating structure has a vertical thickness greater than 10 mm.

Example 21. The antenna of example 1, where each of the inner structure and outer structure include a rigid ring structure.

Example 22. An antenna for plasma processing, the antenna including: an inner structure, the inner structure being conductive; an outer structure, the inner structure being conductive; and a plurality of spiral arms coupling the inner structure to the outer structure, the plurality of spiral arms being conductive, where respective dielectric regions are between adjacent spiral arms of the plurality of spiral arms.

Example 23. The antenna of example 22, where the plurality of spiral arms are part of a rigid, unibody structure.

Example 24. The antenna of example 22, where the number of spiral arms in the plurality of spiral arms is in a range of two to sixteen.

Example 25. An antenna for plasma processing, the antenna including: an inner structure; an outer structure; and an interconnecting structure coupling the inner structure to the outer structure, where the interconnecting structure includes a first spiral cutout and a second spiral cutout, the first spiral cutout and the second spiral cutout being symmetric across a midline of the interconnecting structure.

Example 26. The antenna of example 25, where the first spiral cutout and the second spiral cutout are separated by a dielectric.

Example 27. An antenna for plasma processing, the antenna including: an inner structure; an outer structure; and a plurality of interconnecting structures coupling the inner structure to the outer structure, the plurality of interconnecting structures arranged in a spiral arrangement.

Example 28. The antenna of example 27, where the spiral arrangement includes having a first end of each interconnecting structure coupled to the inner ring structure and a second end of each interconnecting structure coupled to the outer ring structure.

Example 29. The antenna of example 28, where the first end of each interconnecting structure and the second end of each interconnecting structure are disposed at different angles measured from a center point of the antenna.

Example 30. The antenna of example 28, where a respective end of each interconnecting structure, as measured from a center of the each interconnecting structure, have different radii.

Example 31. The antenna of example 28, where a respective end of each interconnecting structure, as measured from a center of the each interconnecting structure, have different radial angles.

Example 32. The antenna of example 28, where radial angles of a respective interconnecting structure are symmetric.

Example 33. The antenna of example 28, where each interconnecting structure has a straight line distance between ends of the each interconnecting structure, and where the straight line distance of a majority of the plurality of interconnecting structures are of a same or a similar length.

Example 34. The antenna of example 28, where the interconnecting structures are spiral elements, the spiral elements being arranged such that a geometry of the spiral elements is unchanged during a rotation of all the spiral elements about an axis of symmetry by an angle equal to 2× divided by an integer greater than 2.

Example 35. The antenna of example 34, where the integer is equal to eight.

Example 36. The antenna of example 34, where the spiral elements have one of two, three, four, eight, or sixteen-fold symmetry.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. An antenna for plasma processing, the antenna comprising:
- an inner ring located in a first plane;
- an outer ring located in the first plane; and
- a plurality of spiral arms located in a second plane, the second plane being above the first plane, each spiral arm of the plurality of spiral arms being connected to the inner ring by a respective conductive offset, and each spiral arm of the plurality of spiral arms being connected to the outer ring by another respective conductive offset.

2. The antenna of claim 1, wherein the antenna is inductively or capacitively couplable to a plasma chamber.

3. The antenna of claim 1, wherein the antenna is a unibody structure.

4. The antenna of claim 1, wherein a resonant frequency of the antenna is between 5 and 100 megahertz (MHz).

5. The antenna of claim 1, wherein the antenna comprises multiple radial zones.

6. The antenna of claim 1, wherein the plurality of interconnecting spiral arms has two spiral arms.

7. The antenna of claim 1, wherein each respective conductive offset comprises a straight sidewall in a perspective view.

8. The antenna of claim 1, wherein each respective conductive offset has a longitudinal dimension perpendicular to the first plane.

9. A system comprising the antenna of claim 1, wherein the system comprises:
- a radio frequency (RF) generator;
- a feeding structure coupling the RF generator to the antenna; and
- a plasma chamber coupled to the antenna.

* * * * *